United States Patent [19]
Awaya et al.

[11] Patent Number: 5,316,796
[45] Date of Patent: May 31, 1994

[54] PROCESS FOR GROWING A THIN METALLIC FILM

[75] Inventors: Nobuyoshi Awaya, Isehara; Yoshinobu Arita, Atsugi, both of Japan

[73] Assignee: Nippon Telegraph and Telephone Corporation, Tokyo, Japan

[21] Appl. No.: 665,610

[22] Filed: Mar. 7, 1991

[30] Foreign Application Priority Data

Mar. 9, 1990 [JP] Japan ............................. 2-56586
Oct. 15, 1990 [JP] Japan ............................ 2-273274

[51] Int. Cl.$^5$ .................. C23C 16/04; C23C 16/06
[52] U.S. Cl. ............................... 427/252; 427/255.1; 427/282
[58] Field of Search ............ 427/252, 250, 248.1, 427/255.6, 96, 99, 255.1, 255.2, 282

[56] References Cited

U.S. PATENT DOCUMENTS

| | | |
|---|---|---|
| 2,576,289 | 11/1951 | Fink . |
| 2,704,728 | 3/1955 | Pawlyk . |
| 2,760,261 | 8/1956 | Pawlyk . |
| 2,833,676 | 5/1958 | Heibel et al. . |
| 3,356,527 | 12/1967 | Moshier ............................ 117/107.2 |
| 3,356,527 | 12/1967 | Moshier et al. . |
| 3,697,342 | 10/1972 | Cuomo . |
| 4,387,134 | 6/1983 | Kalbskopf et al. ................... 428/215 |
| 4,842,891 | 6/1989 | Miyazaki et al. . |
| 5,019,531 | 5/1991 | Awaya et al. . |
| 5,098,516 | 3/1992 | Norman et al. ...................... 156/666 |

FOREIGN PATENT DOCUMENTS

| | | |
|---|---|---|
| 0135179 | 3/1985 | European Pat. Off. . |
| 0297348 | 1/1989 | European Pat. Off. . |

OTHER PUBLICATIONS

Houle et al., "Surface Processes Leading to Carbon Contamination . . . " J. Vac. Sci. Technol. A 4 (6) Nov./Dec. 1986, pp. 2452-2458.

Oehr et al., "Thin Copper Films by Plasma CVD Using . . . " Appl. Phys. A 45, 151–154 (1988).
"Photochemical Generation and Deposition . . . " by Ioues et al., Jan. 1985, American Institute of Physics.
"Vapor Deposition of Metals by . . . " by Van Hemest et al., Nov. 1965, vol. 112, No. 11, University of California.
"Chemical Vapor Depositon of Metals for Integrated Circuit Applications" Green et al., Journal of Metals, Jun. 1985, pp. 63–71.
"Coating the Inside Surfaces of Hollow Sections with a Tantalum Layer for Corrosion Protection", Hiever et al., Siemens Forsch. Entwickl, Springer-Verlag 1977, 232 235.
"Tungsten Contact Hole Filling in a High Vacuum CVD-System", Hieber et al., Jun. 15–16 1987 V-MIC Conf. IEEE, pp. 216–223.

*Primary Examiner*—Shrive Beck
*Assistant Examiner*—Bret Chen
*Attorney, Agent, or Firm*—Spencer, Frank & Schnieder

[57] ABSTRACT

A chemical vapor deposition process for growing a thin metallic film of copper or gold on a substrate includes providing a starting material composed of a $\beta$-ketonato type metal complex of gold or copper in a heated container; preparing a carrier gas for the starting material which is composed of hydrogen as a reducing agent and at least one electron donating substance which bonds to and forms a molecular compound with the starting material by donating an electron to the starting material; passing a flow of the carrier gas through the heated container containing the starting material to form the molecular compound in situ and provide a flow of a gas mixture; introducing the flow of the gas mixture into a reaction chamber in which a substrate is positioned; and growing gold or copper on the substrate by thermally decomposing the molecular compound and any remaining starting material under temperature conditions effective therefor.

8 Claims, 8 Drawing Sheets

1μm

WITHOUT ADDITION OF ISOPROPYL ALCOHOL

1μm

WITH ADDITION OF ISOPROPYL ALCOHOL
1.8 cc/min

PROCESS FOR GROWING A THIN METALLIC FILM

BACKGROUND OF THE INVENTION

1. Field of the Invention

The present invention relates to a process for growing a thin metallic film and an apparatus therefor. Particularly, the present invention relates to a process and apparatus for growing a thin metallic film, which is suitable as metallic wiring in a semiconductor integrated circuit.

2. Description of the Prior Art

Several methods have been proposed for depositing copper or gold, each of which has a high migration resistance and a low electric resistance, instead of aluminum which is a conventional wiring material, in a semiconductor integrated circuit by chemical vapor deposition (CVD).

These methods use as a starting material β-ketonato type materials such as copper or gold acetylacetonate or hexafluoroacetylacetonate cyclopentadienyl type materials such as cyclopentadienyltriethylphosphines, inorganic compounds such as copper nitrate and copper chloride, and the like, and decompose the starting material by heat, plasma, light or the like to deposit the metal contained in the starting material.

β-Ketonato type materials have a relative high vapor pressure and are stable at room temperature, and therefore there have been many proposals for CVD deposition of copper utilizing them.

CVD methods utilizing thermal decomposition include the following known methods.

CVD methods for deposition of copper by thermal decomposition of copper acetylacetonate in an inert gas such as argon, nitrogen or carbon dioxide are disclosed in "METAL COATED DIELECTRICS AND METHOD FOR PRODUCING SAME", U.S. Pat. No. 2,833,676 to Heibel et al. (1954); "METHOD OF BONDING ARTICLES", U.S. Pat. No. 2,760,261 and "GAS PLATING METAL OBJECTS WITH COPPER ACETYLACETONATE", U.S. Pat. No. 2,704,728 to Pawlyk et al. (1952).

A method for thermally decomposing hexafluoroacetylacetonate with a reducing gas such as hydrogen is disclosed in "VAPOR-PLATING METALS FROM FLUOROCARBON KETO METAL COMPOUNDS", U.S. Pat. No. 3,356,527 to Moshier et al., (1964).

A method for thermally decomposing a hydrate of hexafluoroacetylacetonate in hydrogen is disclosed in "Vapor Deposition of Metal by Hydrogen Reduction of Metal Chelates" J. Electrochem. Soc., Vol. 112, No. 11, p.1123 to Hemart et al. (1965); and the like.

Further, the following methods are known as methods for selectively growing metals on substrates using thermal CVD.

A selective growing method utilizing a competitive progress of a growing reaction along with an etching reaction by addition of an etching gas is disclosed in "METHOD OF SELECTIVE CHEMICAL VAPOR DEPOSITION", U.S. Pat. No. 3,697,342 to Cuomo et al. (1970).

A selective growing method utilizing a different substrate without an etching reaction by optimization of conditions in reduced pressure CVD is disclosed in "PROCESS FOR GROWING THIN METALLIC FILM AND APPARATUS THEREFOR", U.S. patent application Ser. No. 07/354,158, Awaya et al..

As a method utilizing a plasma reaction, there has been proposed a method for depositing copper by decomposition of copper hexafluoroacetylacetonate with a glow discharg in hydrogen as disclosed in "Thin Copper Film by Plasma CVD Using Copper-Hexafluoro-Acetylacetonate", Oehr, Appl. Phys. A45, 1988, p.151–154.

Also, as methods utilizing a photochemical reaction, there have been proposed a method for decomposing hexafluoroacetylacetonate or its hydrate with light and heat using a converged argon ion laser and a method for photochemically decomposing hexafluoroacetylacetonate in an alcohol atmosphere using a high pressure mercury lamp or excimer laser (cf. "Process for depositing metallic copper" European Patent Application Publication No. 0135 179 A1, Houle, 1983, "Surface processes leading to carbon contamination of photochemically deposited copper films", Houle, J. Vac. Sci. Technol. A4(6), 1986, p. 2452–2458, and "Photochemical generation and deposition of copper from a gas phase precursor", Jones, Appl. Phys. Lett. 46(1), 1985, p. 97–99).

Also, as a method using cyclopentadienyl type materials, there have been proposed a method for depositing copper by decomposition of cyclopentadienyltriethylphosphine with heat and a method for photochemically decomposing cyclopentadienyltriethylphosphine using laser light ("Method for Chemical Vapor Deposition of Copper, Silver, and Gold Using a Cyclopentadienyl Metal complex" European Patent application Publication No. 0297 348 A1, Beach.

As methods using an inorganic compound, there have been proposed a method for thermally decomposing copper nitrate as disclosed in "DYNAMIC PYROLYTIC PLATING PROCESS", U.S. Pat. No. 2,576,289, 1951, and a method for decomposing copper nitrate utilizing thermal decomposition and plasma as disclosed in "METHOD OF FORMING A COPPER FILM BY CHEMICAL VAPOR DEPOSITION", U.S. Pat. No. 4,842,891, 1989.

The above-described method for forming a copper film by thermal decomposition of β-ketonato type materials is advantageous in that the starting material is relatively stable and therefore easy to handle and enables selective growing by changing the substrate material. Hence, this method makes it possible to completely fill fine holes such as contact holes or through-holes in wirings of a semiconductor integrated circuit, and is a technique compatible with fine processing techniques.

In the above-described methods, however, there tends to occur protrusions and depressions of crystals or gaps in grain boundaries depending on the metal material used for the substrate, thus causing a problem when deposited films are used as wiring material. In addition the above-described methods are difficult to apply to practical production steps for producing integrated circuits because growth rate under conditions where selective growing is realized is as low as 10 nm/min. When a hydrate of hexafluoroacetonate is used in the above-described methods, deposition of a film how good film quality is obtained. However, the hydrate used as a starting material gradually decomposes at its evaporation temperature 50 that it is impossible to assure a stable supply of the starting material to a reaction chamber. Therefore, in this case too, there arises a problem in using the methods in production on an industrial scale.

On the other hand, in the methods for growing thin films by plasma CVD or by simultaneous use of light and heat using β-ketonato type materials as a starting material, it is possible to form a deposited film being which is smooth and has a low resistivity. However, it is difficult to effect selective growth by changing substrate material and coverage in stepped portions is insufficient. Hence, it is difficult to apply the method for growing thin films utilizing plasma CVD to fine wiring formation.

Also, in the methods for growing thin films utilizing only a photochemical reaction, more specifically, methods for depositing metals by photochemically decomposing hexafluoroacetylaceotnate or its alcoholate in an alcohol atmosphere, the deposited film is an amorphous film containing therein 10% or more of carbon, thus failing to provide a good metal film deposition.

SUMMARY OF THE INVENTION

An object of the present invention is to provide a process for growing a thin film with heat using β-ketonato type material as a starting material, which method shows a good selectivity in growth of metal depending on the substrate material.

Another object of the present invention is to provide a process for growing a thin film with heat using a β-ketonato type material as a starting material, which method can give good coverage even on a metal substrate with a stepped portion.

Still another object of the present invention is to provide a process for growing a thin metallic film which can give a film quality equal to that obtained with plasma without losing the favorable features of the thermal decomposition reaction.

Yet another object of the present invention is to provide a process for growing a thin metallic film in which deposition rate can be increased.

A further object of the present invention is to provide an apparatus for growing a thin metallic film, which is well suited to fine metallic wiring adapted to scale up the integration of a semiconductor integrated circuit.

In a first aspect of the present invention, a process for growing a thin metallic film, comprises the steps of:

providing as a starting material a β-ketonato type metal complex of gold or copper;

preparing a mixed gas composed of hydrogen and a substance which can bond to the starting material in a state where an electron is donated from the substance to the starting material to form a molecular compound;

introducing the starting material into a chamber contain a substrate using the mixed gas as a carrier gas; and growing gold or copper on the substrate by chemical vapor deposition.

Here, the substance which forms a molecular compound may be at least one material selected from the group consisting of steam and an organic substance which is a reducing agent.

The substance which forms a molecular compound may be steam, which may be added to the carrier gas at a flow rate of 0.2 to 10% of that of the hydrogen in the carrier gas.

The organic substance which is reducing agent may be an alcohol or tetrahydrofuran.

The substance which forms a molecular compound may be isopropyl alcohol, which may be added to the carrier gas at a flow rate of 0.5 to 8% of that of the hydrogen in the carrier gas.

The organic metal complex may be at least one material selected from the group consisting of bis-acetylacetonato-copper, bis-hexafluoro-acetylacetonato-copper, bis-dipivaloylmethanato-copper, dimethyl-gold-hexafluoro-acetylacetonato, and dimethyl-acetylacetonato-gold.

According to another aspect of the invention, an apparatus for growing a thin metallic film, comprises:

a reaction chamber capable of being evacuated;

substrate holding means for holding and heating a substrate, the substrate holding means being provided in the reaction chamber;

a starting material container for containing a starting material;

an additive container for containing an additive;

heating means for evaporating the starting material in the starting material container;

gas ejecting means having gas ejecting orifices for ejecting a vapor of the starting material together with a reducing gas and the additive, the gas ejecting means being connected to the starting material container;

heating means for increasing a vapor pressure of said additive; and heat exchanging means for circulating a heat exchange medium proximate to said gas ejecting orifices of said gas ejecting means.

According to another aspect of the invention, an apparatus for growing a thin metallic film, comprises;

a reaction chamber capable of being evacuated;

substrate holding means for holding and heating a substrate, said substrate holding means being provided in said reaction chamber;

a starting material container for containing a starting material;

burning means for burning hydrogen with oxygen to produce steam;

gas ejecting means having gas ejecting orifices for ejecting a vapor of said starting material together with a reducing gas and said steam, said gas ejecting means being connected to said starting material container and said burning means; and heat exchanging means for circulating a heat exchange medium proximate to said gas ejecting orifices of said gas ejecting means.

The above and other objects, effects, features, and advantages of the present invention will become more apparent from the following description of embodiments thereof, taken in conjunction with the accompanying drawings.

DETAILED DESCRIPTION OF THE PREFERRED EMBODIMENTS

Figure 1:
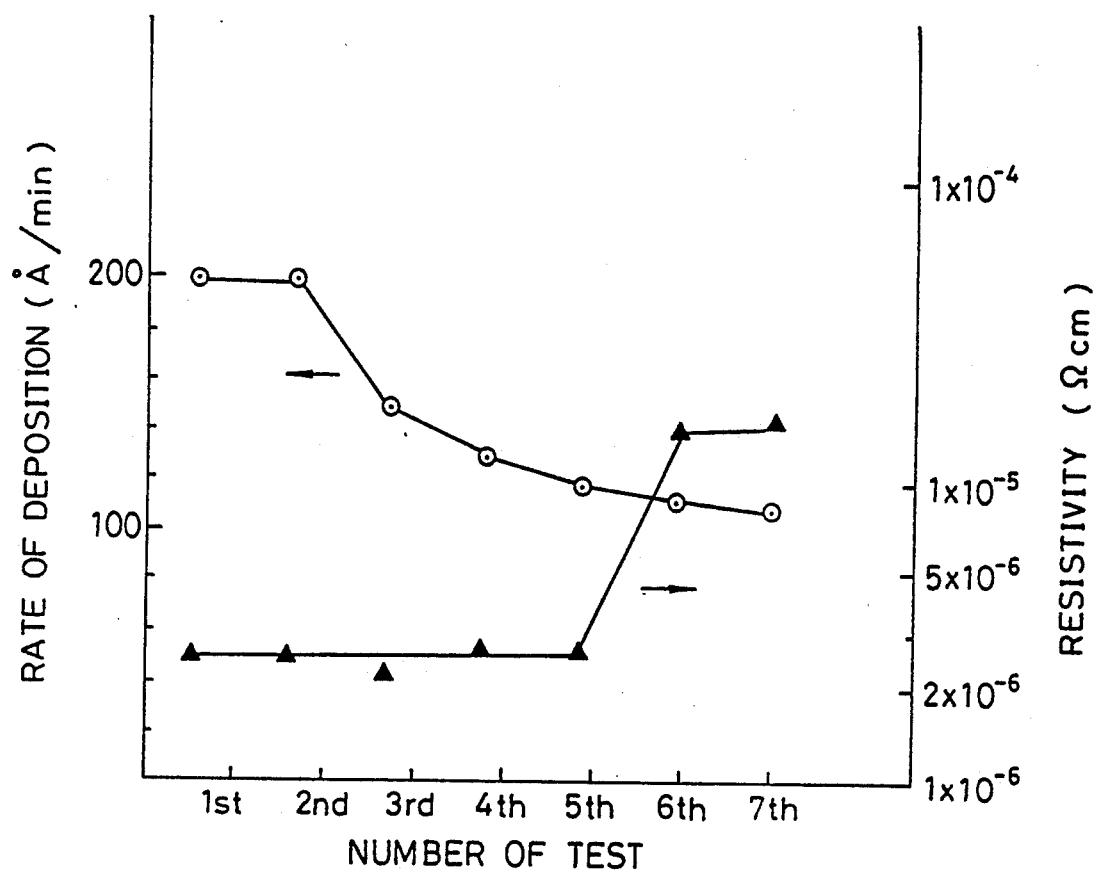
FIG. 1 is a graph illustrating changes in the rate of deposition of copper using the hydrate as a starting material and its resistivity depending on the number of tests.

As a result of extensive experiments and observation made by the present inventors with a view to solving the above-described problems involved in the prior art it was found that when a portion of alcohol or water used in the production of the starting material remained in the starting material' the deposited thin metallic film had a rather good quality. The present invention is based on this discovery and was reached after further experiments and consideration.

In the present invention, a $\beta$-ketonato type metal complex of gold or copper is used as a starting material and hydrogen as a reducing gas as in the inventors earlier application ("PROCESS FOR GROWING THIN METALLIC FILM AND APPARATUS THEREFOR", Awaya et al.; U.S. Pat. No. 5,019,531). However, according to the feature of the present invention, a further substance is used which can be bonded to the starting material to form a molecular compound therewith, such as an alcohol, is mixed with hydrogen, the reducing gas, before contact with the starting material, and the resulting mixed gas is used as a carrier gas for the starting material.

Therefore, the process of the present invention is a process for growing copper or gold on a substrate by a chemical vapor deposition method in which a substance which can form a molecular compound with the starting material, such as an alcohol, is added to a reducing gas beforehand and the starting material is introduced to the substrate using the thus-obtained carrier gas.

Here, the substance which can form a molecular compound (or a complex compound) is a compound which an electron to the $\beta$-ketonate starting material and bonds to the $\beta$-ketonate to form a molecular compound.

As such molecular compound-forming substances, there can be used with favorable results materials having OH bonds which can readily form a molecular compound with a $\beta$-ketonate, for example, alcohols which form alcoholates with the $\beta$-ketonate, steam which forms hydrates with the $\beta$-ketonate, and (water-soluble) organic materials which are polar such as tetrahydrofuran.

In metal complexes of copper (or gold), there is formed an SOMO a single occupied molecular orbital) in which only a single electron having the highest activity exists in a molecular orbital forming an antibonding sigma bond between copper (or gold) and oxygen. Interaction between the electron having the highest activity and free electrons in the substrate metal weakens the bonding between copper (or gold) and oxygen, allowing deposition of copper (or gold) by thermal decomposition to occur and thus making it possible to carry out a selective CVD method by optimizing the conditions. In this case, hydrogen reacts with a ligand decomposed from the complex to release the ligand from the surface of the substrate, thus preventing contamination by impurities such as carbon and oxygen in the deposited film. When a molecular compound is formed in such a state that electrons in the molecule to be bonded to the $\beta$-ketonate such as a hydrate or an alcholate, can be supplied to the $\beta$-ketonate, the bonding between copper (or gold) and oxygen is weakened and the molecular compound tends to be decomposed. Actually, a decrease in the decomposition temperature has been confirmed with respect to hydrates (cf. "Physicochemical Properties of Metalorganic Compounds for MOCVD of Oxides Superconductors [I] Cu(HFA)$_2$'' Yoshida, et al. Extended Abstracts (The 49th Autumn Meeting Vol. 1, p. 115 (1988)) The Japan Society of Applied Physics. Because of this phenomenon, density of nuclei formation in an initial stage of deposition increases and adjacent growing crystal grains are readily connected to each other so that a smooth film can be formed. Also, it is possible to increase the rate of deposition.

However, these molecular compounds are unstable at evaporation temperatures being about 60° C. and hence water or alcohols are released in a relatively short time, so that the molecular compound in the starting material container decreases according to lapse of time and, in accordance therewith, reproducibility of the film forming process is aggravated. This is a barrier which was overcome on the way from the above-described discovery to the present invention.

FIG. 1 shows an example of an experiment in which reproducibility was bad when a molecular compound was used. In this experiment, a hydrate of hexafluoroacetylacetonato-copper was filled in a 150 g-container. Deposition was carried out under the conditions of a substrate temperature of 350° C., a starting material temperature of 75° C., a hydrogen gas flow rate of 130 ml/min., and a total pressure of 2,000 Pa. The graph in FIG. 1 illustrates the deposition rate for every experiment carried out under the above-described conditions for 10 minutes (an open circle) and the resistivity of the deposited film (closed triangle). As will be apparent from the graph, stable deposition rate continued for only two runs and until 5 g to 10 g of the starting material was consumed.

Accordingly, in the present invention, the molecular compound is adjusted just before it is supplied to the reaction chamber. More specifically, a substance which forms a molecular compound with the starting material, such as steam or an alcohol, is passed together with hydrogen gas through the starting material container to form a molecular compound in situ, which is immediately supplied to the reaction chamber. This can stabilize the reaction and increase its reproducibility. Further, in this case, hydrogen gas not only is intended to release decomposed ligand as earlier explained but also has the effect of preventing oxidation of copper with oxygen so that a stable thin film growth can be realized.

In the present invention, unlike decomposition of the starting material with plasma or light, thermal decomposition reaction is used for decomposing the molecule of the starting material, and therefore no active excited species is generated and metal, in a state where a sensitivity to the properties of the substrate is retained, can be supplied. As a result, according to the present invention, selective growth is possible and covering on stepped portions of the substrate can be carried out well and efficiently.

As described above, according to the present invention, there is no loss of the characteristic features of the thermal decomposition reaction. Selectivity for the material is good and a good covering property can be obtained even on metal substrates with a stepped portion. Accordingly, a film quality equal to that obtained utilizing plasma can be attained according to the present invention and in addition thereto the deposition rate can be increased. Therefore, according to the present invention, a thin metallic film can be formed, which is well suited to fine metallic wiring adapted to scale up the integration of a semiconductor integrated circuit.

Figure 2A:
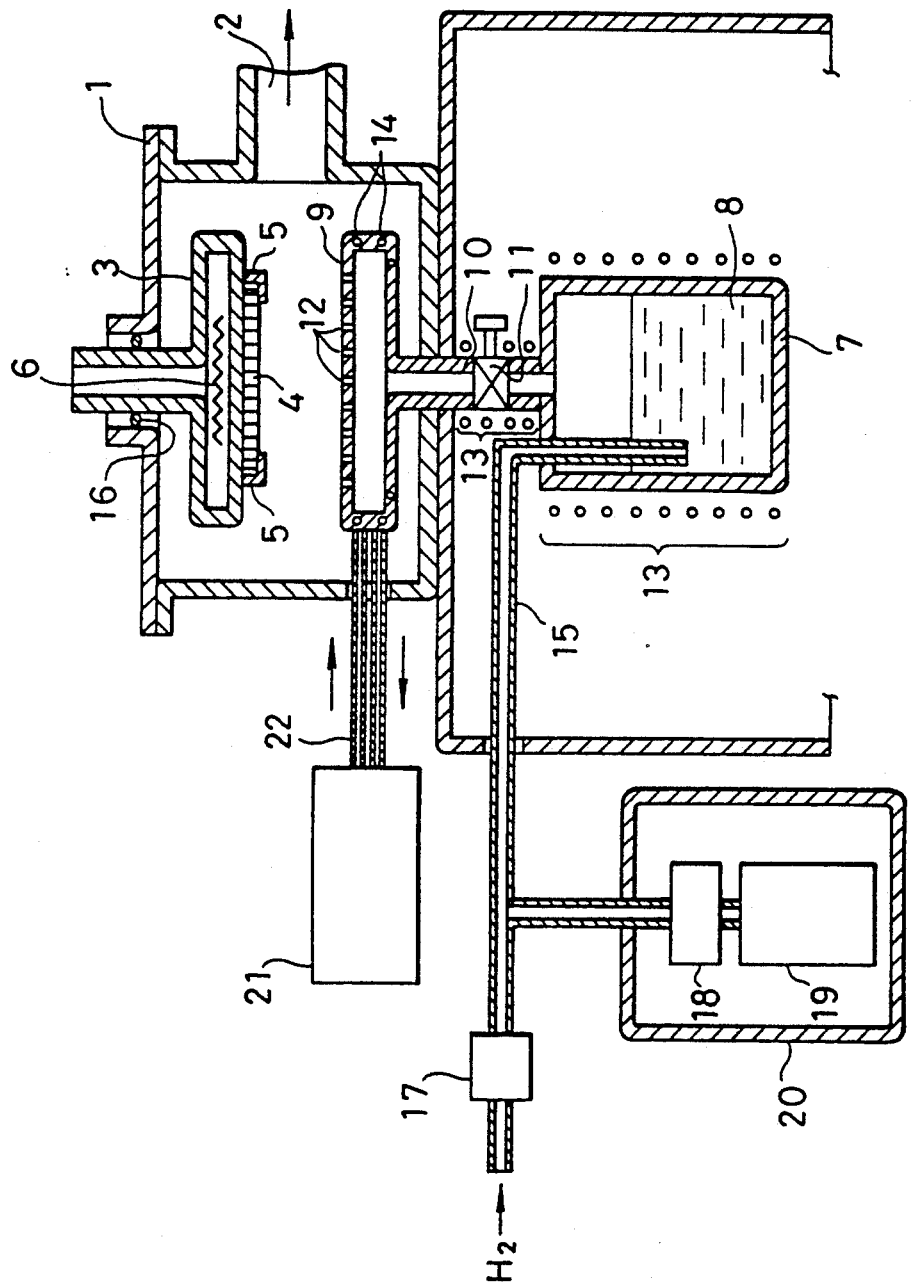
FIGS. 2A and 2B are schematic cross-sectional views showing two embodiments of the apparatus for growing a thin metallic film, which is used to carry out the process of the present invention.

The apparatus for forming a thin metallic film according to the present invention is an improvement of the apparatus described in "PROCESS FOR GROWING THIN METALLIC FILM AND APPARATUS THEREFOR", U.S. patent application Ser. No. 07/354,158 by Awaya, et al. FIG. 2A shows a schematic construction of an embodiment of an apparatus of this invention.

Figure 2B:
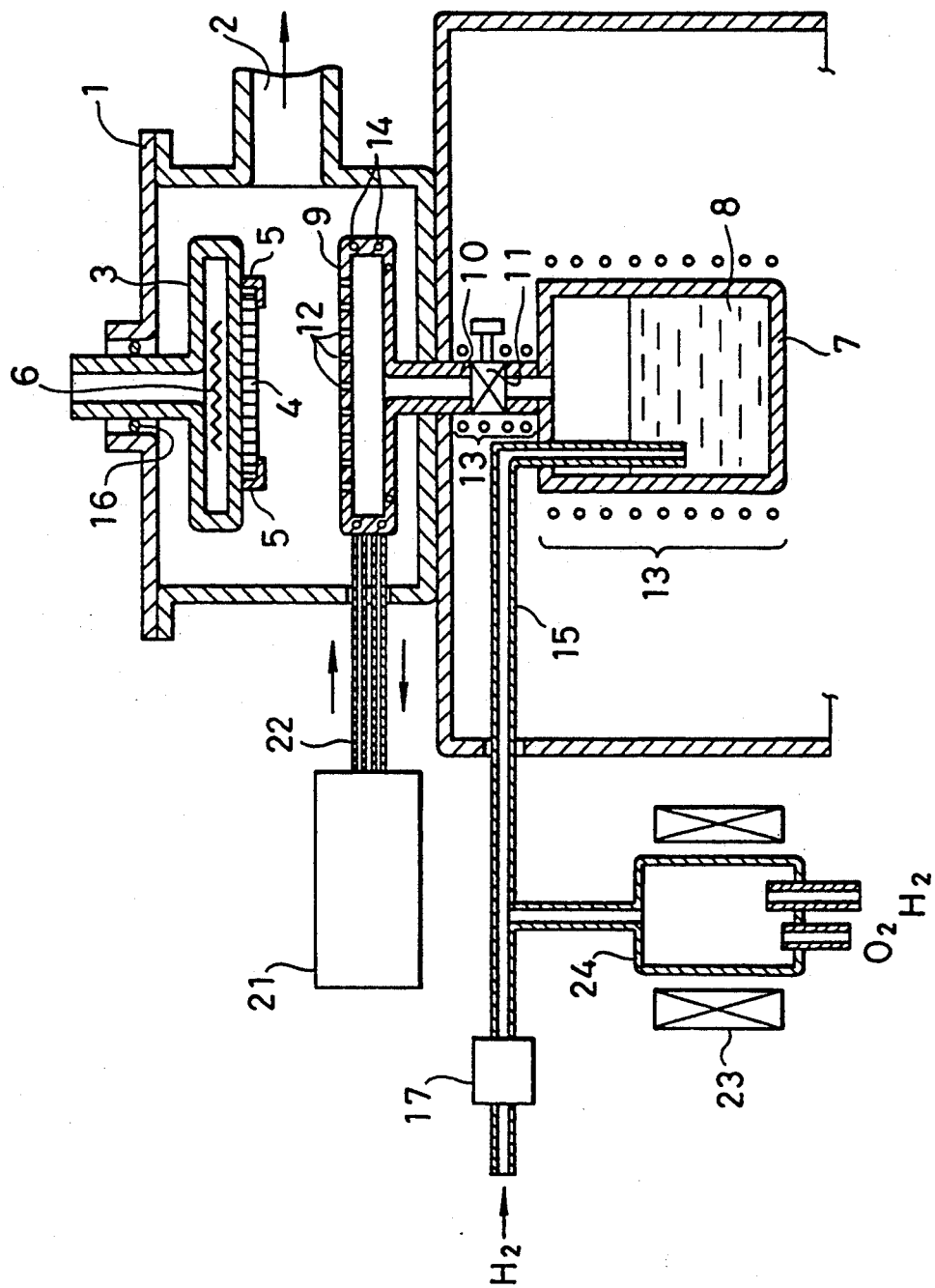

A reaction chamber 1 can be evacuated through an evacuation aperture 2 with a pumping system. A specimen substrate holder 3 for holding a specimen substrate 4 which has plate springs 5 is provided in the reaction chamber 1. A heater 6 is built in the specimen substrate holder 3, and can heat the specimen substrate 4 to a predetermined temperature. A starting material container 7 for containing a starting material 8 consisting of an organic complex or organometallic compound of gold or copper, is provided on the outside of the reaction chamber 1. A gas ejecting panel 9 confronts the specimen substrate holder 3 inside the reaction chamber 1 is connected through a pipe 10 and a valve 11 to the starting material container 7. The gas ejecting panel 9 has numerous fine gas ejecting orifices 12. The starting material container 7, the pipe 10, and the valve 11 are heated to a predetermined temperature with a heater 13, while the gas ejecting panel 9 is heated to a predetermined temperature with a heater 14 built therein. The heater 14 is preferably of a type using a heat exchanger 21 in which oil is circulated. A reducing carrier gas such as hydrogen gas is introduced through piping 15 into the starting material container 7. Reference numeral 16 denotes an O-ring and 17 and 18 denote a mass flow controller, respectively, connected to one end of piping 15. The flow rate of a reducing carrier gas, for example, hydrogen gas is controlled by the mass flow controller 17, and that of at least one of an alcohol, tetrahydrofuran, and steam (i.e., a substance which bonds and forms a molecular compound with the starting material) is controlled by the mass flow controller 18. These are introduced in the starting material container 7 passing through the piping 15. The mass flow controller 18 and an additive container 19 for containing a substance which can bond and form a molecular compound with the starting material (additive) are desirably housed in a heating bath 20 in order to increase the vapor pressure of the additive. When steam is used as an additive, hydrogen gas and oxygen gas may be burned by being heated by a heater 23 in a combustion chamber 24 as shown in FIG. 2B, to generate steam, and the steam may be introduced together with hydrogen gas to the reaction chamber 1. Alternatively, the gas ejection plate 9 may be connected to the heat exchanger 21 through an oil piping 22 so that the temperature can be controlled.

A vapor of the starting material 8 evaporated by heating in the starting material container 7 as described above is ejected together with the hydrogen gas and the additive (at least one of an alcohol, tetrahydrofuran and steam) through the gas ejecting orifices 12 and fed onto the surface of the specimen substrate 4 held by the specimen substrate holder 3. It was found through a number of experiments that the vapor of the starting material 8 is susceptible to the material of the surface of the specimen substrate 4 in such a way that it is decomposed on a specific material selected from among aluminum, titanium, chromium, zirconium, tungsten, molybdenum, tantalum, vanadium, and silicides thereof to grow thereon gold or copper, while it is not decomposed on other specific materials selected from among metallic oxides, such as silicon oxide, and metallic nitrides, such as silicon nitride and titanium nitride, so that it fails to grow thereon gold or copper. This is attributable to a difference in the catalytic action on the reductive decomposition reaction of the vapor of the starting material 8 with the reducing gas between the two kinds of materials. Accordingly, choice of the former kind for material as the material of the surface of the specimen substrate can realize growth of gold or copper on the whole surface of the specimen substrate, while by varying the kind of material to be applied to a predetermined area or areas of the surface of the specimen substrate, gold or copper can be grown selectively in the predetermined area or areas of the surface of the specimen substrate so that selective growth of gold or copper only can be realized. In effecting such selective growth, it is important to appropriately set the temperatures of the gas ejecting orifices 12, that is the gas injecting panel 9, and the specimen substrate 4.

Figure 3:
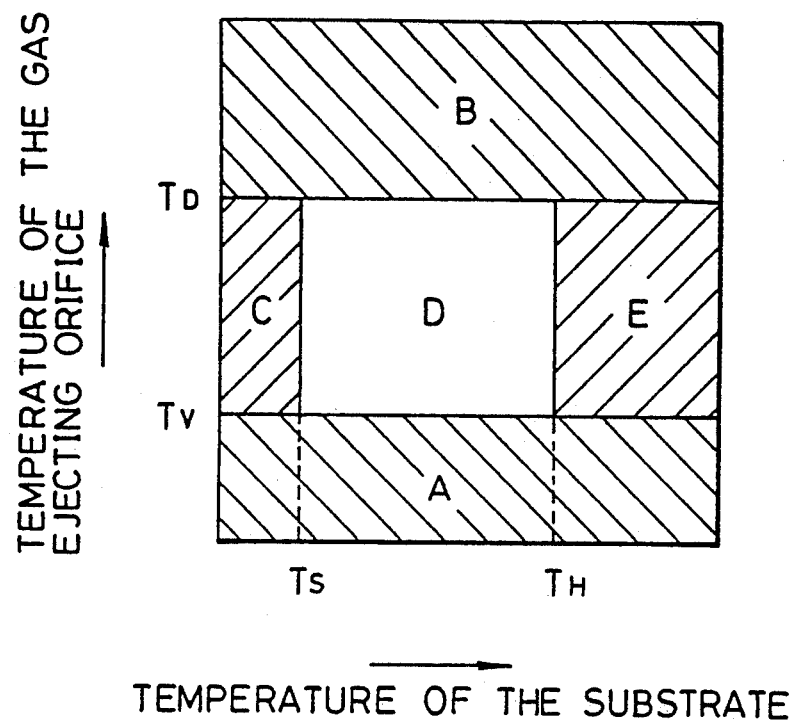
FIG. 3 is a model diagram illustrating conditions under which selective growth is effected according to the present invention.

FIG. 3 illustrates the typical variation of the state of growth of gold or copper with the temperatures of the gas ejecting orifice and the specimen substrate. In the region A wherein the temperature of the gas ejecting orifice 12 is equal to or lower than the solidification and precipitation temperature $T_V$ of the starting material 8, the vapor of the evaporated starting material is solidified on the gas ejecting panel 9 to fails to be ejected therethrough in a gaseous form. Therefore, this region is a temperature range wherein no growth of gold or copper occurs irrespective of the temperature of the specimen substrate 4. In the region B wherein the temperature of the gas ejecting orifice 12 is equal to or higher than the decomposition temperature $T_D$ of the vapor of the starting material 8, when passing through the orifices 12, the vapor of the starting material 8 is decomposed, and gold or copper in an atomic or molecular form then reach the surface of the specimen substrate 4 and grows on the whole surface of the specimen substrate 4 irrespective of the materials of the surface of the specimen substrate 4. Therefore, the temperature of the gas ejecting orifices 12 must be not only higher than the solidification and precipitation temperature $T_V$ of the starting material 8 but must also be higher than the decomposition temperature $T_D$ of the vapor of the evaporated starting material 8. On the other hand, when the temperature of the specimen substrate 4 is lower than the decomposition temperature $T_S$ of the vapor of the starting material 8 on the specific material on which gold or copper is to be selectively grown, the vapor of the starting material fed onto the surface of the specimen substrate 4 does not decompose to fails to grow thereon gold or copper. The region C corresponds to such a temperature range. Only in the region D wherein the temperature of the gas ejecting orifices 12 or that of the gas ejecting panel 9 is higher than the solidification and precipitation temperature $T_V$ of the organic complex or organometallic compound of gold or copper as the starting material 8 and lower than the decomposition temperature $T_D$ thereof, while the temperature of the specimen substrate 4 is at least the decomposition temperature $T_S$ of the vapor of the starting material when it is presented on the specific material on which gold or copper is to be selectively grown can gold or copper be grown on the predetermined area of the surface of the specimen substrate.

Additionally stated, if the gas ejecting panel 9 is made of a metal such as aluminum or titanium, the above-mentioned two decomposition temperatures $T_D$ and $T_S$ are substantially equal to each other. In the region E wherein the temperature of the specimen substrate 4 exceeds $T_H$ and is too high i.e., the temperature about crystal grains of gold or copper selectively grown on the specimen substrate 4 become unfavorably, coarse and provide a rough surface thereof. The value of $T_H$ is not definite. The temperature of the specimen substrate 4 should be higher than the $T_S$, but is preferably not higher than $T_S$ plus about 200° C. Particularly, when the process of the present invention is incorporated into a process for producing a semiconductor integrated circuit, it is not preferable to raise the temperature of the specimen substrate to a high degree.

As a starting material, $\beta$-diketonate compounds of copper of gold, such as bis-acetylacetonato-copper, bis-hexafluoroacetylacetonato-copper, bis-dipivaloyl-methanato-copper, dimethyl-gold-hexafluoroacetylacetonato or dimethyl-gold-acetylacetonato or a mixture thereof can be used.

EXAMPLE 1

An experiment was carried out for growing a thin copper film using the above-described apparatus, wherein bis-hexafluoroacetylacetonato-copper was used as the starting material for growing copper and isopropyl alcohol was as used the alcohol. The conditions of growing were as follows.

As the substrate, a substrate was used which was prepared by forming a film of silicon dioxide on a surface of a silicon substrate and then forming a metal layer (e.g., chromium) on a part thereof by conventional lithography and sputtering. The temperature of the starting material container and the temperature of the gas ejection portion were set at 72° C. and 130° C., respectively, and isopropyl alcohol together with hydrogen gas was introduced in the reaction chamber as a carrier gas.

Figure 4:
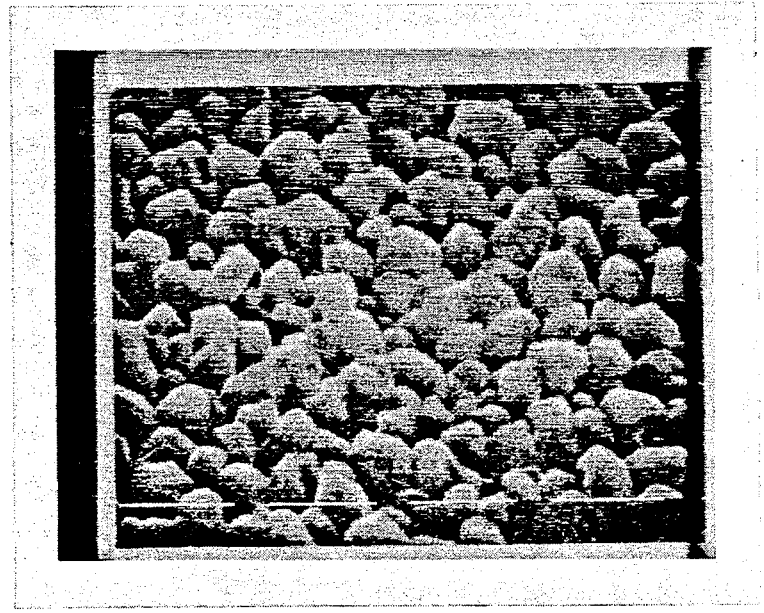
FIG. 4 is a scanning electron micrograph showing the crystalline structure of copper deposited without addition of isopropyl alcohol.

When the total pressure, the temperature of the specimen substrate, the flow rate of the hydrogen gas, and the flow rate of the isopropyl alcohol were set to be 2,000 Pa, 350° C., 100 ml/min., and 0 ml/min., respectively, a deposition reaction did not occur on the insulation film but deposition of a film occurred only on the metal substrate. However, as shown in FIG. 4 (a scanning electron micrograph of the surface of the deposited film), crystal grains in the film which grew did not couple with each other completely, and electrical resistivity was as high as 4 $\mu\Omega$ cm for a film thickness of 300 nm.

When the temperature of the substrate was 320° C. or lower, it was possible to obtain a deposited film having a smooth surface and a low resistivity, but deposition rate was too slow to be practical.

Figure 5:
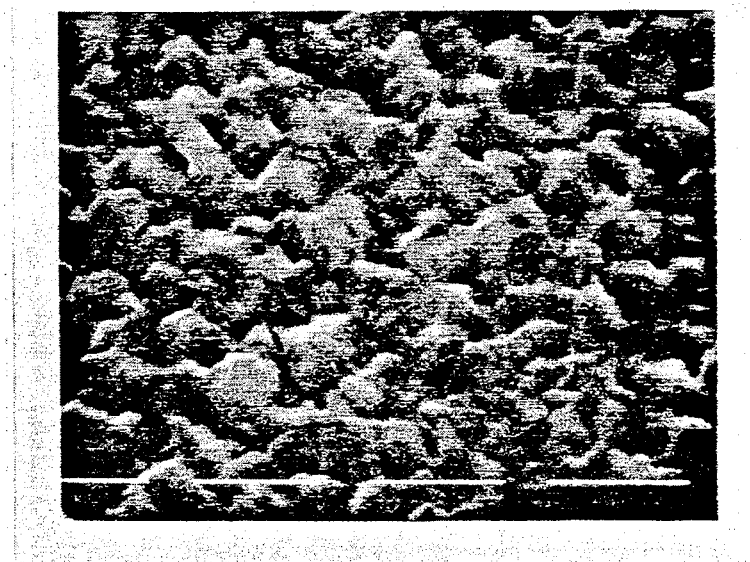
FIG. 5 is a scanning electron micrograph showing the crystalline structure of copper deposited with addition of isopropyl alcohol.

When isopropyl alcohol at a flow rate of 1.8 ml/min. was introduced together with the hydrogen gas at a flow rate of 100 ml/min., while retaining properties of selective growth, the crystal grains did couple to form a smooth surface as shown in FIG. 5 at a substrate temperature of 350° C., thus giving a film having a film thickness of 300 nm and a resistivity as low as 2.0 $\mu\Omega$ cm.

While a copper film having the best quality was obtained under the above-described conditions, the effect of the addition of isopropyl alcohol was obtained within a wider range of flow rates, i.e., 0.5 to 8 ml/min.

When the temperature of the starting material container, the temperature of gas ejection orifices, the temperature of the specimen, the flow rate of the hydrogen gas and the pressure inside the reaction chamber were set at 50° to 150° C., 50 to 200° C., 250° to 450° C., 100 to 1,000 ml/min., and 200 to 5,000 Pa, respectively, growth of copper occurred.

In addition to hexafluoroacetylacetonato-copper, other $\beta$-ketonato type starting materials, for example, pivaloylmethanato-copper, dimethyl-gold-hexafluoroacetylacetonato, and the like gave similar effect.

A similar effect can also be obtained using other alcohols, such as methyl alcohol.

EXAMPLE 2

A copper film was grown using hexafluoroacetylacetonato-copper as the starting material and tetrahydrofuran as the substance forming a molecular compound with the starting material. An example of conditions of deposition is shown below. Using the same apparatus and substrate as was used in Example 1, the temperature of the starting material, and the temperature of the gas ejection orifices were set at 72° C. and 130° C., respectively, and hydrogen gas and tetrahydrofuran were introduced in the reaction chamber 1 as the carrier gas.

When the total pressure, the temperature of the specimen substrate, the flow rate of the hydrogen gas, and the flow rate of the tetrahydrofuran were set at 2,000 Pa, 350° C., 100 ml/min., and 3 ml/min., respectively, a film was obtained having crystal grains coupled to a form a smooth surface and having a film thickness of 200 nm and a resistivity as low as 2.0 $\mu\Omega$ cm.

EXAMPLE 3

A copper film was grown using hexafluoroacetylacetonato-copper as the starting material and steam as the substance forming a molecular compound with the starting material. An example of conditions of deposition are shown below. Using the same apparatus and substrate as was used in Example 1, the temperature of the starting material, and the temperature of the gas ejection orifices were set at 72° C. and 130° C., respectively, and hydrogen gas and steam were introduced in the reaction chamber 1 as the carrier gas.

When the total pressure, the temperature of the specimen substrate, the flow rate of the hydrogen gas, and the flow rate of the tetrahydrofuran were set at 2,000 Pa, 350° C., 100 ml/min., and 0 to 4 ml/min., respectively, a film was obtained having crystal grains coupled to form a smooth surface and having a film thickness of 200 nm and a resistivity as low as 2.0 $\mu\Omega$ cm.

Figure 6:
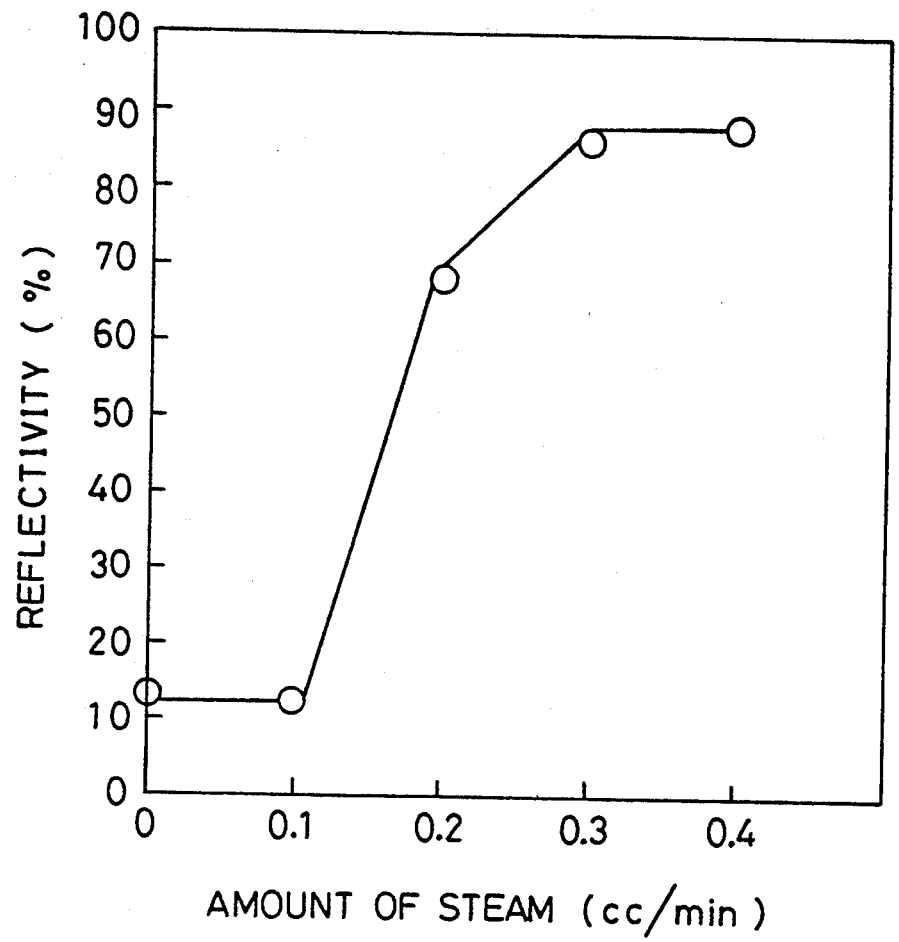
FIG. 6 is a graph illustrating dependency of reflectivity of the deposited film on the amount of steam added.

Then, the influence of the amount of steam added on the smoothness of the deposited copper film was examined. Under the same conditions as in the preceding examples, except that a chromium substrate was used as the substrate, the amount of the hydrogen gas added was varied within the range of 0 to 0.4 ml/min. and reflectivity of the deposited film was measured. FIG. 6 illustrates the dependency of the reflectivity of the deposited film on the amount of steam employed. The light used for measurement had a wavelength of 700 nm. Results are shown as rated values taking the reflectivity of a copper film deposited by sputtering as 100%. When no steam was added, reflectivity was very low, as low as 10%, but addition of 0.2 ml/min. of steam increased reflectivity to about 70%. Reflectivity reached 85% or higher when 0.3 m./min. or more of steam was added. This confirmed that a film was formed having a smoothness close to that deposited by sputtering.

EXAMPLE 4

Figure 7:
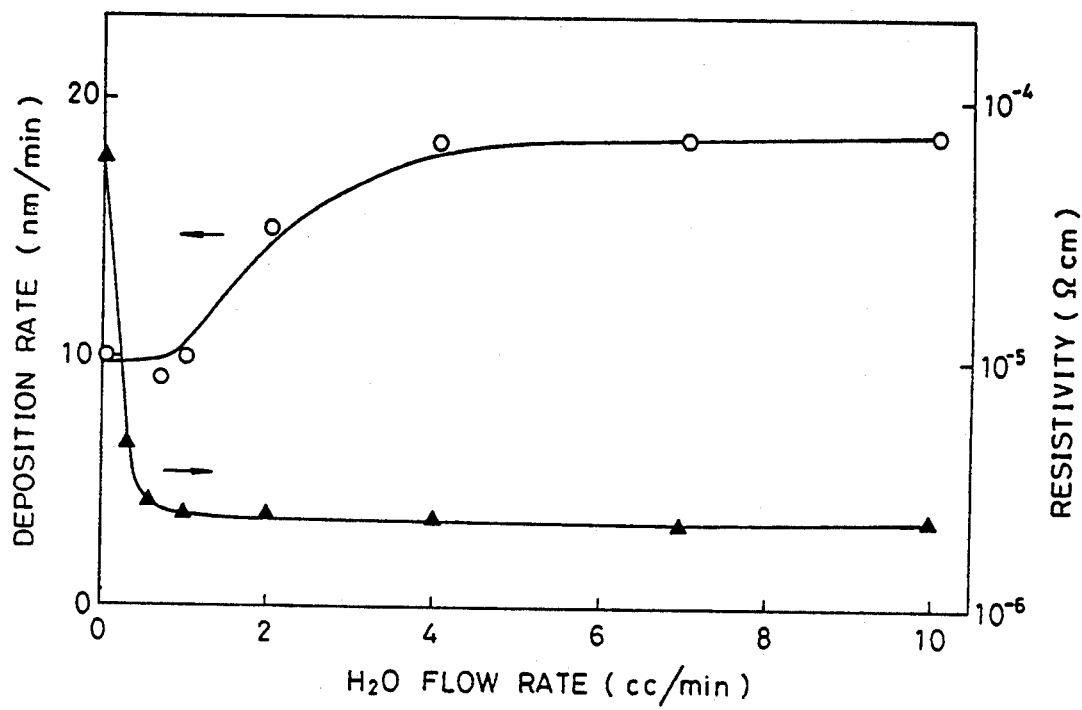
FIG. 7 is a graph illustrating the rate of deposition of copper and resistivity of the deposited copper film when the amount of steam added was varied from 0.2 ml/min. to 10 ml/min.

In this example, experiments were carried out under the same conditions as in Example 3 except that the amount of steam was increased. With an increase in the amount of the steam added, the deposition rate increased greatly. FIG. 7 shows the deposition rate (open circle) and resistivity of the deposited copper film (closed triangle) when the temperature of the specimen substrate, the temperature of the starting material container, the flow rate of the hydrogen gas carrier, and the flow rate of the tetrahydrofuran were set at 350° C., 75° C., 130 ml/min., and 0.2 to 10 ml/min., respectively.

The resistivity decreased to 2.0 $\mu\Omega$ cm at a steam flow rate of 0.5 ml/min. or higher, while the deposition rate started to increase at a steam flow rate of 2 ml/min. and reached a level as high as 17 nm/min., which is about double the value obtained without addition of steam, at a steam flow rate within the range of 4 to 10 ml/min.

Figure 8:
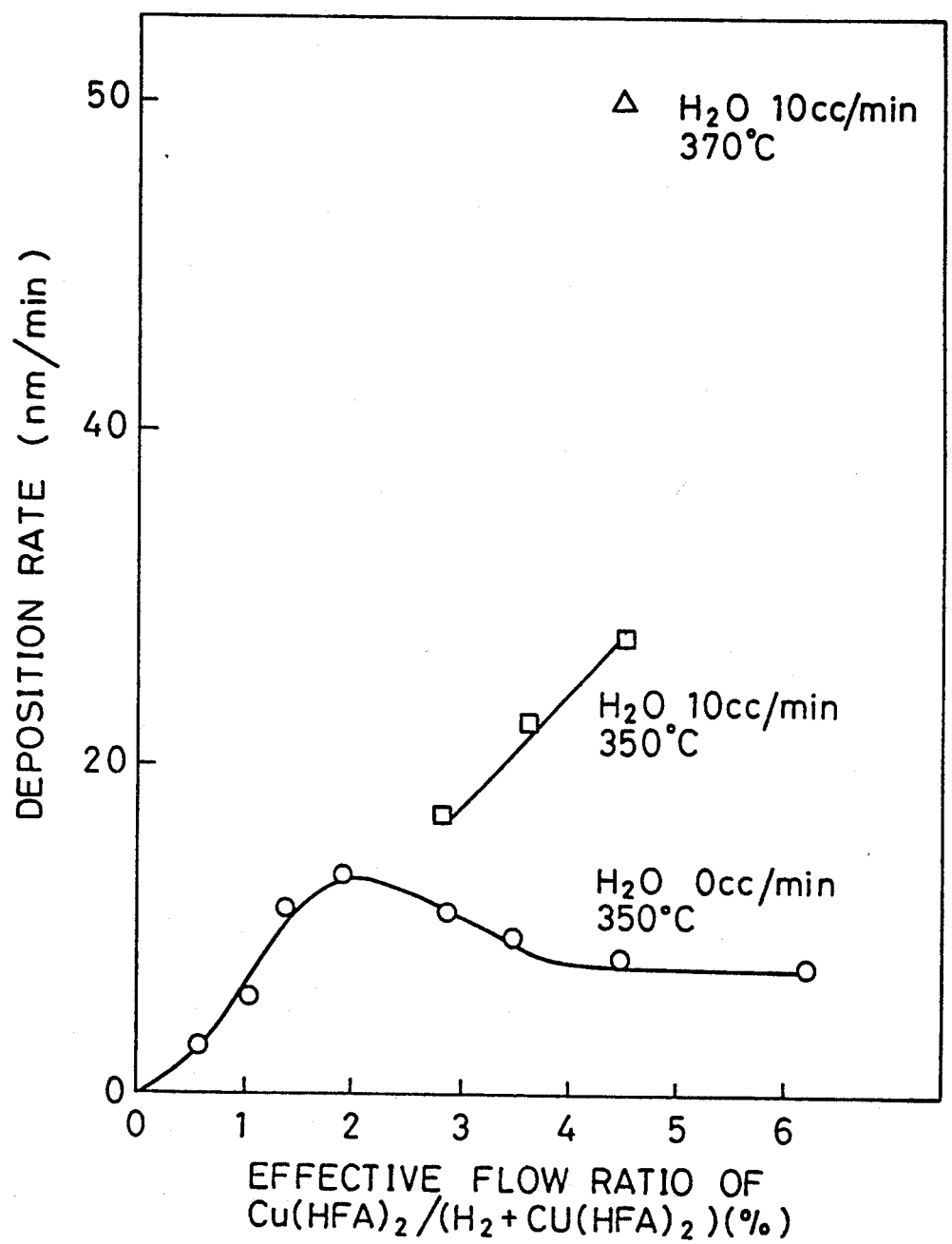
FIG. 8 is a graph illustrating the rate of deposition when the flow rate of steam was fixed at 10 ml/min. and the temperature of the starting material container was elevated.

As shown in FIG. 8, when the flow rate of the hydrogen gas and the temperature of the specimen substrate were set at 10 ml/min. and 350° C., respectively, and the temperature of the starting material container was increased, the deposition rate increased up to 28 nm/min. with the temperature of the starting material container being at 87° C. When no steam was added, the deposition rate once reached a maximum in the vicinity of 75° C. with an increase in the amount of the starting material supplied and thereafter decreased. In contrast thereto, addition of steam exhibited a remarkable effect of increasing the deposition rate.

Further, when the temperature of the specimen substrate was increased up to 370° C. and the temperature of the starting material container was fixed 87° C., the deposition rate increased up to 50 nm/min. With no steam, it was observed that an increase in the temperature of the substrate under the instant conditions resulted in no increase in the deposition rate.

Under the above-described conditions of addition of steam, in every case the resistivity of the film deposited was within the range of 2.0 to 1.9 $\mu\Omega$ cm and a good smooth film was formed while retaining the selectivity of the substrate material, causing no film formation on the insulating layer but only allowing selective growth on the metal. In the case where the metal was placed all the entire of the substrate, excellent coverage was obtained.

EXAMPLE 5

In the present invention, the additive may be two or more of the materials referred to in the preceding examples. In this example, 0.5 ml/min. of steam and 0.5 ml/min. of ethyl alcohol were mixed with hydrogen gas under the conditions of temperature of the specimen substrate, temperature of the starting material, the flow rate of the hydrogen gas, the total pressure being set at 350° C., 75° C., 130 ml/min., and 200 Pa, respectively, and the resulting mixed gas was used as a carrier gas. When the experiment was carried out under the above-described conditions, a film was obtained having a good quality, and having a film thickness of 200 nm and a resistivity of 2.0 $\mu\Omega$ cm.

Other embodiments will be apparent to those skilled in the art from consideration of the specification and practice of the invention disclosed herein. It is intended that the specification and examples be considered as exemplary only, with the true scope of the invention being indicated by the following claims.

What is claimed is:

1. A thermal chemical vapor deposition process for growing a smooth metallic film of copper or gold on a substrate, the process comprising:
    (a) providing a starting material composed of a $\beta$-ketonato type metal complex of gold or copper in a container provided with heating means to evaporate the starting material;
    (b) preparing a carrier gas mixture which is composed of hydrogen as a reducing gas and at least one electron donating substance which bonds with the starting material by donating an electron to the starting material to form a molecular compound which is a hydrate or an alcoholate;
    (c) passing a flow of the carrier gas mixture through the starting material contained in the heated container, which heated container is connected with a reaction chamber, to form the molecular compound in situ immediately before the molecular compound is supplied to the reaction chamber;
    (d) introducing the flow of the carrier gas carrier mixture which includes the molecular compound immediately into the reaction chamber and onto a surface of a heated substrate disposed in the reaction chamber, said surface being at least partially covered with metal; and
    (e) depositing a smooth metallic film of gold or copper onto metal portions of the surface of the substrate by thermally decomposing the molecular compound and any remaining starting material under temperature conditions effective for such thermal decomposition.

2. The process as claimed in claim 1, wherein the at lease one electron donating substance is at least one material selected from the group consisting of steam and an organic substance which is a reducing agent.

3. The process for growing a thin as claimed in claim 2, wherein the at least one electron donating substance is steam, and wherein the steam is added to the hydrogen at a flow rate ranging from 0.2 to 10% of that of the hydrogen.

4. The process as claimed in claim 2, wherein the organic substance which is a reducing agent is selected from the group consisting of an alcohol and tetrahydrofuran.

5. The process as claimed in claim 4, wherein the at least one electron donating substance is isopropyl alcohol, and wherein the isopropyl alcohol is added to the hydrogen at a flow rate ranging from 0.5 to 8% of that of the hydrogen.

6. The process as claimed in claim 1, wherein the $\beta$-ketonato type metal complex is at least one material selected from the group consisting of bis-acetylacetonato-copper, bis-hexafluoroacetylacetonato-copper, bis-dipivaloylmethanato-copper, dimethyl-gold-hexafluoro-acetylacetonato, and dimethyl-acetonato-gold.

7. The process as claimed in claim 1, wherein the surface of the substrate is substantially completely covered with metal, and wherein the smooth metallic film of copper or gold is deposited on the metal to substantially completely cover same.

8. The process as claimed in claim 1, wherein the surface of the substrate is composed of a metal and an insulator, and wherein the smooth metallic film of copper or gold is selectively deposited on the metal.

* * * * *